United States Patent [19]

Vandegraaf

[11] Patent Number: 5,450,622
[45] Date of Patent: Sep. 12, 1995

[54] METHOD AND APPARATUS FOR PROVIDING A VERY FAST ACTING NOISE SQUELCH CONTROL SYSTEM FOR AN RF RADIO RECEIVER

[75] Inventor: Johannes J. Vandegraaf, Lynchburg, Va.

[73] Assignee: Ericsson Inc., Research Triangle Park, N.C.

[21] Appl. No.: 734,482

[22] Filed: Jul. 23, 1991

[51] Int. Cl.⁶ .............................................. H04B 1/10
[52] U.S. Cl. .................................. 455/222; 455/213; 455/220; 455/307
[58] Field of Search ............... 455/212, 213, 218, 220, 455/222, 223, 396, 307, 194.1

[56] References Cited

U.S. PATENT DOCUMENTS

| | | | |
|---|---|---|---|
| 3,769,592 | 10/1973 | Espe | 325/478 |
| 3,851,253 | 11/1974 | Eastmond | 455/220 X |
| 3,934,206 | 1/1976 | Holecek | 455/221 X |
| 3,979,679 | 9/1976 | Bush et al. | 325/348 |
| 4,085,370 | 4/1978 | van der Poel et al. | 325/348 |
| 4,132,953 | 1/1979 | Martin, III | 325/478 |
| 4,176,286 | 11/1979 | Shuffield, Jr. | 307/237 |
| 4,359,780 | 11/1982 | Day | 455/222 |
| 4,479,250 | 10/1984 | Flood | 455/213 |
| 4,731,868 | 3/1988 | Dreier | 455/161 |
| 4,888,815 | 12/1989 | Ahlemeyer | 455/168.1 |
| 4,947,456 | 8/1990 | Atkinson et al. | 455/165 |
| 4,972,510 | 11/1990 | Guizerix et al. | 455/212 |
| 5,199,109 | 3/1993 | Baker | 455/222 X |

Primary Examiner—Edward F. Urban
Attorney, Agent, or Firm—Nixon & Vanderhye

[57] ABSTRACT

A fast acting noise squelch control circuit for FM radio receivers samples the noise above the audio band to determine the presence of an RF carrier. The detected noise signal is integrated by a low-pass frequency gain integrating filter and compared, using a high gain differential amplifier, against a preset squelch threshold voltage to provide a signal indicative of the presence or absence of a received carrier. The output of the integrating filter is initialized at a reference voltage that is only slightly below the threshold voltage setting for the comparator to minimize integration time and increase sensitivity of the squelch. In this manner, a long time constant in the noise integrating filter can be used without having to wait for a long time to establish whether a carrier signal is present. After a predetermined observation interval, the comparator output is checked and the comparator threshold voltage setting is lowered if a carrier of sufficient signal strength has been detected to increase the squelch control circuit hysteresis. The improved squelch control system can be utilized in intermittent or scanning receiver systems while using the normal noise filtering as would be employed in continuously operated receivers without having to use a long "turn-on" period that would result in unacceptably slow cycling rates.

19 Claims, 4 Drawing Sheets

METHOD AND APPARATUS FOR PROVIDING A VERY FAST ACTING NOISE SQUELCH CONTROL SYSTEM FOR AN RF RADIO RECEIVER

FIELD OF THE INVENTION

The present invention relates generally to squelch circuitry used in radio receivers to eliminate noise between intervals of signal transmission. More particularly it relates to an improved squelch circuit wherein the squelch turn-on delay time is significantly reduced without requiring a large amount of squelch threshold hysteresis typically necessary in fast acting squelch circuits. The improved squelch circuit is especially applicable to FM receivers operating in a power saving or intermittent mode and can also be used advantageously in scanning receivers where it is desirable to have the squelch operate as rapidly as possible.

BACKGROUND OF THE INVENTION

In radio receivers, particularly in mobile and high gain FM communication receivers, it is well known to utilize squelch circuits to automatically cut off the audio output in the absence of a received carrier in order to prevent annoying receiver noise from being audible during intervals between signal reception. Upon the reception of a reasonable strength carrier signal following an interval of silence, the squelch circuit reactivates the audio output, allowing the signal to be heard as long as it is present. However, prior art squelch circuits for controlling the audio output of radio receivers, particularly FM scanning receivers, typically suffer from the problem of having long turn-on and turn-off delay times. This can produce an initial loss of audio output upon reception of weaker transmissions and allows an annoying burst of noise or "squelch-tail" at the end of a transmission. Although squelch circuits having a very short time constant could be used, they are problematic because the squelching operation of the receiver then becomes overly sensitive to any temporary or rapid variations in the strength of the received signal, commonly referred to as "flutters" or "fades", which cause the squelch to produce annoying intermittent interruptions in the audio output.

In a scanning receiver or in "priority search" type applications, a conventional noise squelch system would discriminate against low signal level transmissions, since the squelch operation is too sluggish, whereas a very fast acting squelch would require a large amount of hysteresis for satisfactory operation. It is thus desirable to provide a fast acting squelch circuit which does not interrupt the audio during temporary fluctuations in signal strength due to flutters or fades and which also prevents the occurrence of a long squelch tail at the end of strong transmissions. The present invention addresses these problems and is particularly applicable toward achieving fast squelch operation in FM receivers operating in an intermittent mode (e.g., a power saving mode) or in scanning receivers.

In FM receivers, the receiver noise above the audio band is commonly used to indicate the presence of a carrier signal. A suitable threshold value for the noise level is established for a receiver (depending on its particular signal to noise ratio characteristics) and is used to determine when to enable or disable the receiver's audio output. A block diagram of a conventional prior art noise squelch system of this sort is illustrated in FIG. 1. Typically, the above audio band receiver noise is filtered to remove the lower frequency speech components, then amplified and rectified. This detected noise voltage is subsequently integrated and the integration output is then compared with a DC squelch threshold reference voltage by a comparator. The decision output of the comparator is then used to control a muting switch in the audio output path.

Referring to the prior art example illustrated in FIG. 1, the signal from a radio receiver FM demodulator 10 is typically filtered by a high-pass filter or a band-pass filter 12 to extract the above-audio band noise. This noise signal is amplified by the noise amplifier 14 and rectified by noise rectifier 16 to produce a DC voltage output. This detected noise voltage can be used as a measure of the strength of a received FM carrier signal. If the detected voltage is directly related to the above audio band noise level, then it will be inversely related to the received FM signal strength. Accordingly, noise rectifier 16 is often designed to produce a detected voltage that is inversely related to the noise level so that it will be directly related to FM signal strength. A prior art squelch circuit of this general sort is disclosed by U.S. Pat. No. 4,359,780 to Day (1982).

In the FIG. 1 depiction of a typical prior art circuit, the DC voltage output from noise rectifier 16 is applied to input 17 of squelch control circuit 20. Within squelch control circuit 20, the detected noise voltage is filtered to eliminate low-frequency DC fluctuations and integrated by low-pass filter/integrator 18. The integrated signal is compared to a predetermined squelch threshold voltage by comparator 19, and the decision output 11 is used to indicate RF carrier activity.

Additional exemplary prior art squelch circuit configurations are disclosed in the following U.S. Patents:
U.S. Pat. No. 3,769,592 to Espe (1973)
U.S. Pat. No. 3,979,679 to Bush et al (1976)
U.S. Pat. No. 4,085,370 to Vanderpole et al (1978)
U.S. Pat. No. 4,132,953 to Martin, III (1979)
U.S. Pat. No. 4,176,286 to Shuffield, Jr. (1979)
U.S. Pat. No. 4,479,250 to Flood (1984)
U.S. Pat. No. 4,731,868 to Dreier (1988)
U.S. Pat. No. 4,947,456 to Atkinson et al (1990)
U.S. Pat. No. 4,972,510 to Guizerix et al (1990)

Usually, the comparator in a squelch control circuit is designed with some positive feedback to minimize any "dithering" of the squelch output about a pre-set reference threshold noise level caused by fluctuations in the rectified detected noise output. This is accomplished by providing hysteresis in the setting of the squelch comparator threshold level so that the receiver will unsquelch at a higher level input RF signal strength than it takes to squelch it. However, in order for a squelch circuit to operate as rapidly as possible, it is essential that the filtered and integrated output of the noise rectifier reach its final value quickly. This implies using a relatively wide bandwidth low-pass filter with the filter/integrator 18 in the squelch control circuit. Unfortunately, the use of a relatively wide bandwidth filter also inherently allows relatively large fluctuations in the integrator DC output. This necessitates designing the squelch circuit comparator with a large amount of hysteresis to keep the squelch from "bobbling" around a single set reference threshold noise level. However, a large amount of hysteresis is undesirable since it reduces the effective sensitivity of the receiver and allows annoying squelch-tail noise bursts at the end of transmissions and, in a scanning type of receiver context, may cause one to entirely bypass lower level RF carriers.

BRIEF SUMMARY OF THE INVENTION

The present invention circumvents these problems by taking advantage of certain known and predictable characteristics of FM receivers and, in particular, FM radio receivers utilizing a frequency synthesizer and capable of operating in an intermittent or power saving mode or in a scanning mode. More specifically, in such receivers, there exists a predictable "turn-on" delay period before the receiver is able to produce a usable signal because the receiver's frequency synthesizer requires a short period to "lock on" to a selected channel. The duration of this initial turn-on delay is usually known or predicable for a particular receiver design. Accordingly, in the present exemplary embodiment of this invention, a signal path to the filter is established only after expiration of this known turn-on delay period, when a useful signal input to the FM demodulator can be expected. Additionally, since the threshold setting of the noise comparator is a predetermined parameter, the delay incurred by the integrator output in reaching that preset level can be substantially reduced by biasing or initializing the integrator output close to (e.g., just below) that threshold level. The noise comparator decision output then can be sampled after a much shortened interval—e.g., commensurate only with the time constant of the integrator's low-pass filter and its initialized pre-biased output level. The comparator threshold level may then subsequently be changed (depending on its sampled output) to dynamically adjust the amount of decision hysteresis required in the functioning of the squelch for a particular receiver.

In accordance with a preferred exemplary embodiment of the present invention, the establishment of a rectified noise signal path, the initializing of the integrator output and the changing of the noise comparator threshold level are each accomplished under microprocessor control via electronic switches, (e.g., MOS-transconductance gates). The general use of microprocessor controllers in FM radio receivers for performing various switching, timing and control functions is itself known in the art (e.g., see U.S. Pat. No. 4,947,456 to Atkinson et al). Accordingly, the additional programming of a microcontroller to accomplish the few added switching and timing functions of the present invention (e.g., as a part of the typical signal acquisition or control module of such computer program) would be well within the level of ordinary skill in this art. Alternatively, the squelch control switching signals for implementing the above functions could be generated by using digital logic and timing circuits comprising conventional modules such as "one-shots" or monostable multivibrators formed from circuits in any form (e.g., as discrete circuits, as part of larger integrated circuits, etc.)

Briefly described, the invention provides an improved fast acting noise squelch control circuit for FM radio receivers. The input to the squelch control circuit is obtained from a noise detector circuit that is responsive to high frequency noise above the audio frequency band (e.g., 6 kHz to 25 kHz). The noise input signal is integrated by a limited low-frequency gain operational amplifier integrator and compared, using a high gain differential amplifier comparator, against a preset squelch threshold voltage to indicate the presence or absence of a received carrier. In this manner, the output of the comparator provides a carrier activity signal that is used to control muting of the receiver audio output. In the improved squelch control circuit of the present invention, the integrator output is initialized at a voltage level that is only slightly below the preset squelch threshold voltage setting for the comparator to minimize integration time delay. If an FM carrier of sufficient signal strength is detected beyond a predetermined period of time, the amount of squelch hysteresis is then subsequently increased by lowering the squelch threshold voltage setting of the comparator.

BRIEF DESCRIPTION OF THE DRAWINGS

These as well as other objects and advantages of this invention will be more completely understood and appreciated by carefully studying the following detailed description of a preferred exemplary embodiment taken in conjunction with the accompanying drawings, of which.

DETAILED DESCRIPTION OF A PREFERRED EMBODIMENT

Figure 1:
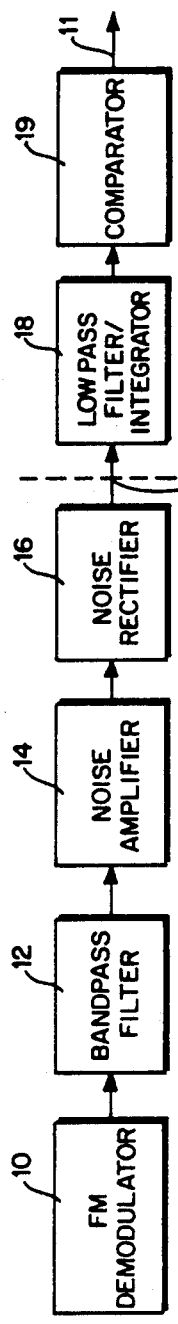
FIG. 1 is a block diagram representing a conventional prior art noise squelch system for an FM receiver.
Figure 2:
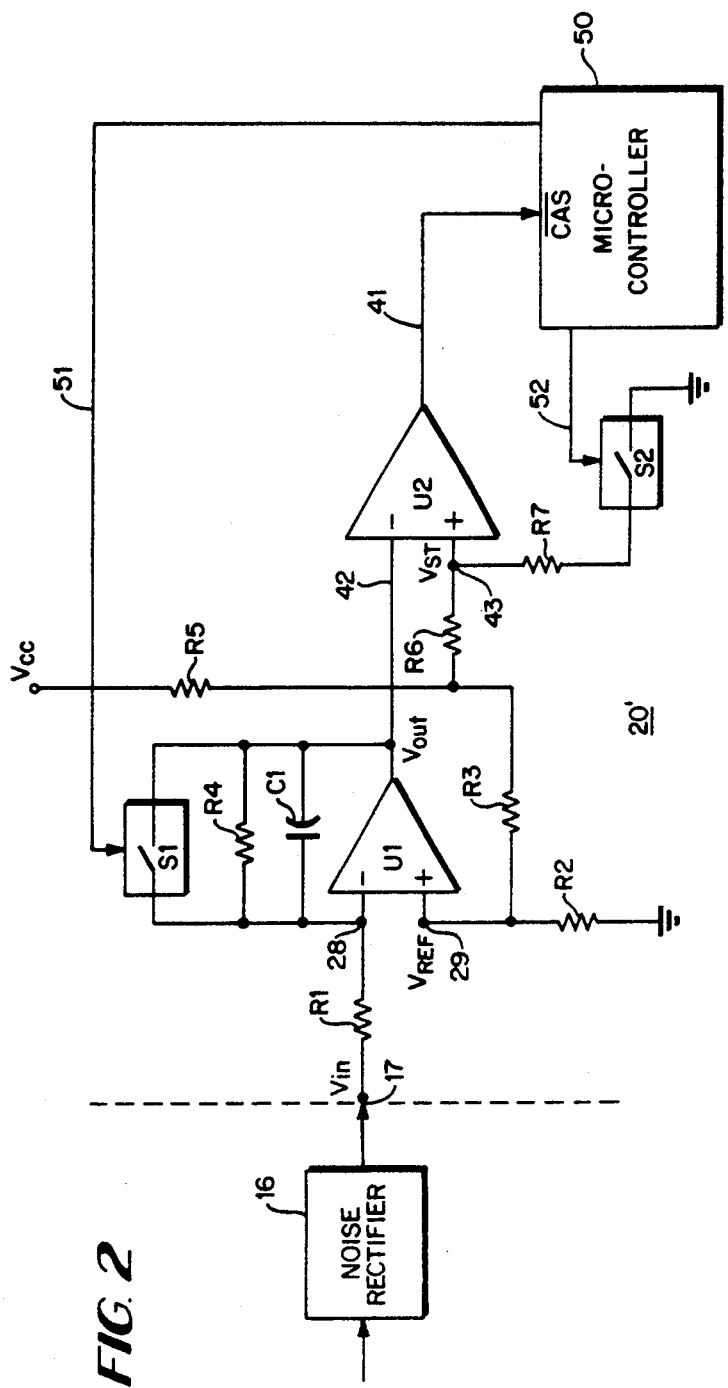
FIG. 2 is a schematic diagram of a fast acting squelch control circuit in accordance with an embodiment of the present invention.

Referring to FIG. 2, there is illustrated in an improved squelch control circuit 20' for an FM radio receiver. This circuit can be utilized with any communications receiver containing a wide band discriminator and capable of sampling the noise above the audio band to determine the presence of an RF carrier. The detected noise signal, $V_{in}$, from the output of the noise rectifier 16 is applied to the inverting input 28 of operational amplifier (op-amp) U1 via resistor R1. With the parallel combination of resistor R4 and capacitor C1 in a feedback path from output to inverting input, op-amp U1 functions as a limited low-frequency gain integrator and, thus, also operates as a low-pass filter. An initializing reference voltage, $V_{ref}$, is provided to the non-inverting input 29 of op-amp U1 by the voltage divider configuration of resistors R2, R3, and R5. In order to initialize the output voltage, $V_{out}$, of op-amp U1 to $V_{ref}$, (i.e., to effectively eliminate unnecessary time delay in getting the filter output up to a value nominally commensurate with the noise signal as soon as it becomes available), a controllable switch S1 is coupled in parallel with resistor R4 and capacitor C1. For the particular circuit arrangement depicted in FIG. 2, the output of op-amp U1 is given by the following equation:

$$V_{out} = -V_{in} \cdot \frac{R4}{R1(1 + sC1 \cdot R4)} + V_{ref} \cdot \frac{R1 + R4}{R1}$$

The transfer function, $V_{out}/V_{in}$, for the limited low-frequency gain integrator, U1, is of the form of a simple one pole RC low-pass filter, as follows:

$$K \cdot \frac{1}{1 + sT} + \text{Constant}$$

Where, $$K = -\frac{R4}{R1}$$

$T = C1.R4$
$s = jw$

In a preferred exemplary embodiment of the present invention, switch S1 is controlled by microprocessor 50. When S1 is closed, the output of op-amp U1 is shorted to its inverting input 28 and $V_{out}$ becomes equal to $V_{ref}$ regardless of the input signal, $V_{in}$, from noise rectifier 16 (i.e. if R4=0, then $V_{out}=V_{ref}$). If the average output voltage from noise rectifier 16 equals $V_{ref}$, then the DC output of integrator U1 equals $V_{ref}$. However, when the rectified noise $V_{in}$ at input 17 exceeds $V_{ref}$, then the output voltage $V_{out}$ of integrator U1 will be below $V_{ref}$ and vice versa. If S1 is closed, the output of integrator U1 is held at $V_{ref}$, independent of the signal level at input 17.

Referring again to FIG. 2, the output of integrator U1 is coupled to the inverting input 42 of op-amp U2 which functions as a comparator. Op-amp U2 may be any type of general high gain differential amplifier. The non-inverting input 43 of op-amp 40 is coupled to the common junction of resistors R3 and R5 via resistor R6 to provide an initial predetermined squelch noise level threshold reference voltage, $V_{ST}$, for comparator U2 which is slightly greater than the reference voltage, $V_{ref}$ used to initialize the output of integrator U1. The non-inverting input 43 of op-amp U2 is also coupled to controllable switch S2 via resistor R7. Switch S2 is coupled between resistor R7 and a circuit ground and is also controlled by microcontroller 50. The output of comparator U2 is coupled to a sampled data input port of microcontroller 50 and provides a signal to a Carrier Activity Sensor (CAS) input function of the programmed microcontroller that indicates whether the detected noise signal at squelch control circuit input 17 is above or below the squelch noise threshold reference level established by $V_{ST}$. Microcontroller 50 samples the signal on the CAS input at desired times (e.g., initially at the predetermined time a useful CAS signal is first expected following receiver turn-on or carrier lock-on) and uses its status to implement audio muting in the receiver and control squelch level hysteresis via switch S2.

When the radio receiver is first powered up or when a scanning receiver is acquiring a new channel, switch S1 is initially maintained in the closed position and switch S2 is kept open. Consequently, the output of U1 is initialized at $V_{ref}$. Since the initial squelch noise level threshold voltage, $V_{ST}$, at comparator U2 is slightly higher than $V_{ref}$, the output on line 41 of comparator U2 is high, indicating a "no carrier present" condition. After an initial predetermined delay period allowing the frequency synthesizer of the receiver time to properly lock on frequency, the receiver is able to provide a meaningful detected noise output from noise rectifier 16. Switch S1 is then opened by a signal from microcontroller 50 on line 51. During this time, switch S2, also controlled by microcontroller 50 via line 52, is maintained in the open position, assuring no immediate change in squelch noise level threshold voltage $V_{ST}$.

When switch S1 is opened, the detected noise voltage at squelch control circuit input 17 is integrated by U1 and the integrator's output voltage, $V_{out}$, will begin to ramp either up or down, depending on whether the average detected noise at input 17 is below or above $V_{ref}$. If a sufficiently high level RF carrier signal is being received (i.e., no above-audio band noise signal detected), output voltage $V_{out}$ of integrator U1 will rise above squelch noise level threshold voltage $V_{ST}$ and the output signal of comparator U2 on line 41 will go low. Since the output of integrator of U1 is initialized at a level that is already close to the comparator threshold, a long RC time constant can be used in implementing the noise integrating filter without experiencing an excessive integration delay time to establish whether a carrier signal is present.

At the end of a predetermined observation interval, during which the detected noise signal is continuously integrated, microcontroller 50 checks the CAS input line 41 to determine the output decision status of comparator 40. If line 41 is low, the microcontroller 50 closes switch S2 via switch control signal line 52. Once switch S2 is closed, the initial squelch noise level threshold voltage, $V_{ST}$, is lowered by the voltage divider combination of resistors R6 and R7. This provides squelch decision hysteresis for squelch control circuit 20 in the operation of comparator U2 by assuring that the CAS input line 41 will stay low unless the output of noise integrator U1 declines below this new lower threshold level. Thus, the detected noise voltage at input 17 must now increase materially before the signal on CAS input line 41 will go high indicating a need to squelch the receiver audio output.

Accordingly, if the CAS input line 41 is low at the end of the integration interval, indicating an adequate RF carrier signal input to the receiver, the receiver audio is left turned on until the new noise threshold is exceeded. The fact that the microcontroller checks the CAS input line only after a predetermined observation interval, assures that no premature noise level determination is made despite the close initial proximity of integrator output voltage $V_{out}$ to the decision threshold voltage level, $V_{ST}$, of comparator U2. At the end of a received transmission, the detected noise will exceed the new threshold. Switch S2 is then opened, and switch S1 is closed to reinitialize the squelch control circuit.

Figure 3:
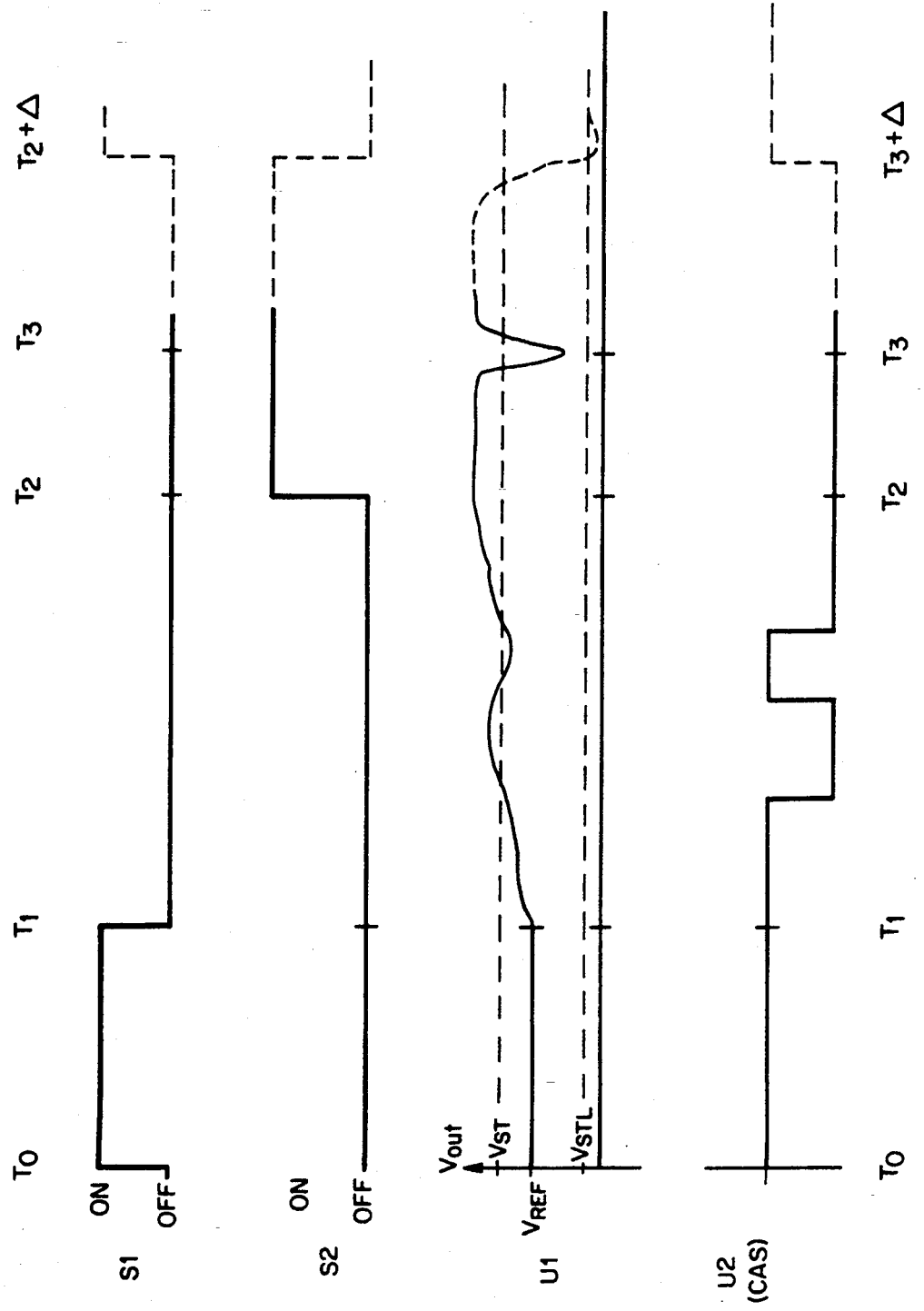
FIG. 3 is a relational timing diagram for the states of the controlled switches and the carrier activity sensor output of the comparator in the squelch control circuit of FIG. 2.

FIG. 3 depicts a generalized timing diagram showing the output of integrator U1, the output of comparator U2 and the relative on and off status for the controlled switches S1 and S2, in FIG. 2. Switch S1 is kept closed during an initial delay interval from $T_0$ to $T_1$ to allow the receiver time to settle and lock on frequency. After an integration observation interval from $T_1$ to $T_2$, the output of comparator U2 is monitored by microcontroller 50 to determine carrier activity status. Depending on the status of CAS input line 41, the initial squelch noise level threshold voltage $V_{ST}$ is lowered (e.g., to $V_{STL}$) at time T2 by closing S2 or the circuit is reinitialized before the receiver acquires a new channel frequency. The squelch control circuit is also reinitialized if the received carrier signal strength causes the integrated noise output of U1 to fall below the lowered threshold voltage, $V_{STL}$, at a time later then $T_2$; for example, at a time $T_3 + \Delta$. The squelch control circuit will not be reinitialized, however, for temporary or rapid "fades" in received carrier signal strength which do not cause the integrated noise output of U1 to fall below $V_{STL}$, as for example, at time $T_3$.

Figure 4:
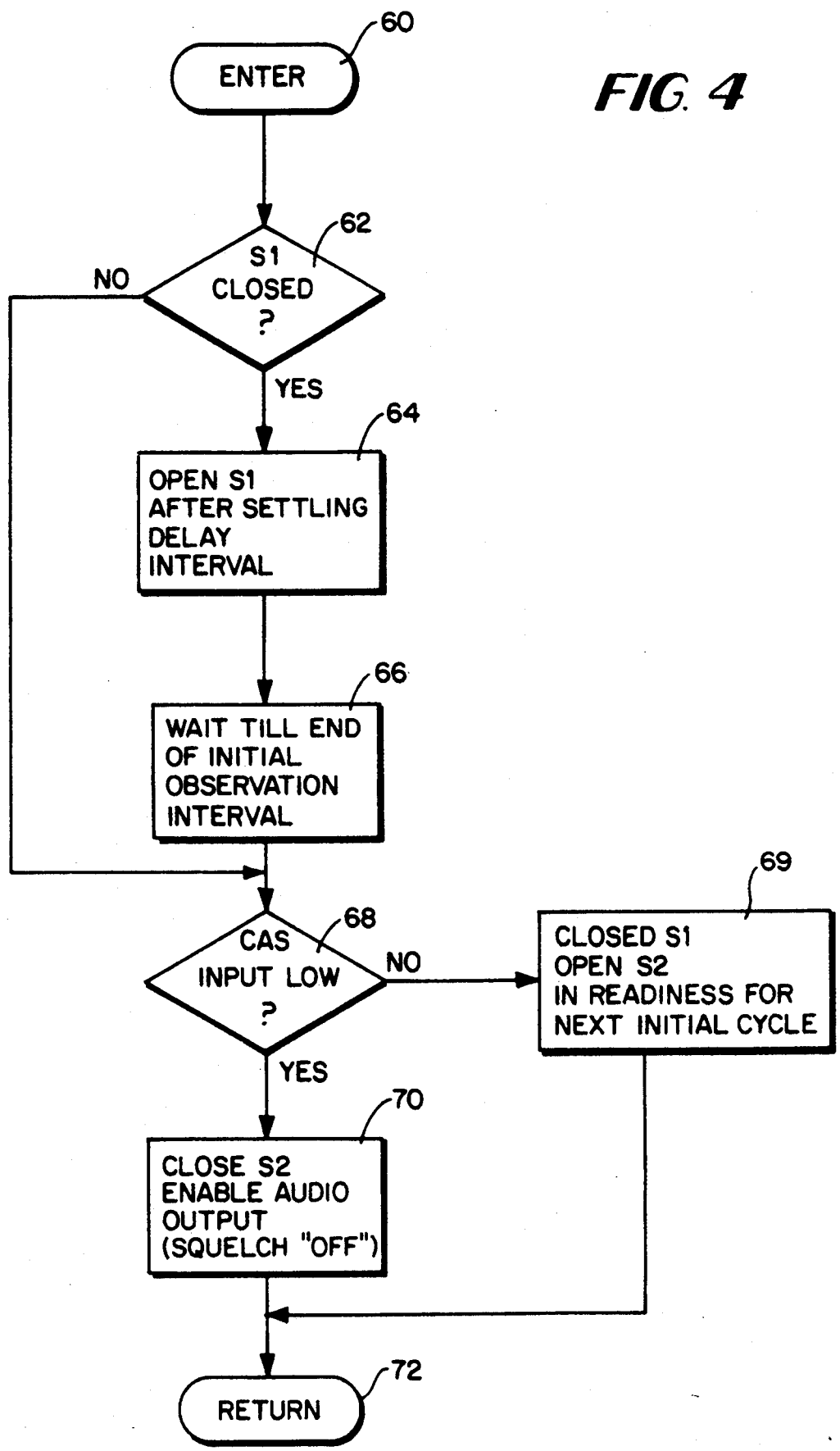
FIG. 4 is a flowchart of an exemplary program executed by the microcontroller of FIG. 2 for controlling the operation of the squelch circuit in accordance with an embodiment of the present invention.

FIG. 4 depicts a flowchart for a typical program module to be executed periodically by microcontroller 50 for controlling the timing and on/off states of switches S1 and S2 for proper operation of the squelch control circuit 20' When the receiver is initially powered up or when switching to a new channel, the squelch circuit control program is entered at step 60. Switches S1 and S2 are assumed to have been initialized in closed and open conditions at some earlier time (e.g., by an initial initialization at operator turn-on of the entire system or by an initial pass through the module of FIG. 4). If the initial conditions (e.g., S1 closed) are detected at decision point 62, then switch S1 is opened after a short receiver settling delay at step 64. A predetermined nominal integration interval is observed at step 66 before the CAS input is monitored at decision step 68. Depending on the status of the CAS input, S2 is closed to lower the squelch comparator threshold and introduce hysteresis at step 70 during unsquelched reception or the control circuit is reinitialized at step 69 before return to a main calling program at 72. Alternatively, if the program segment of FIG. 4 is entered for a periodic check of CAS during previously unsquelched reception, then decision step 62 will cause control to skip immediately to the CAS check at 68.

Figure 5:
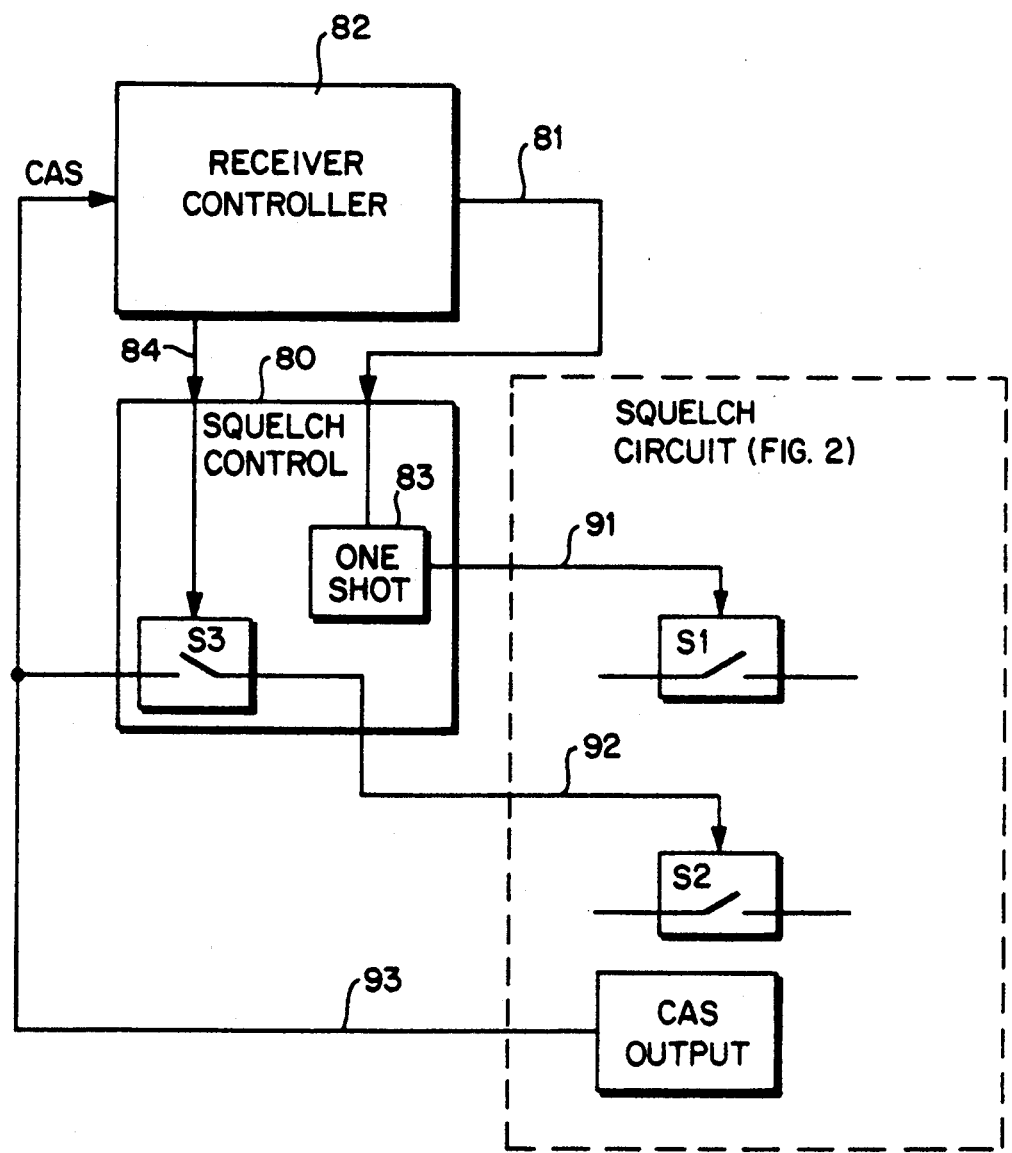
FIG. 5 is a schematic diagram of an alternate embodiment for a squelch circuit switch controller.

FIG. 5 depicts an alternate embodiment for a switch controller for the squelch circuit of FIG. 2. In this embodiment, a hardware controller 80 is provided as separate from a primary receiver controller circuit 82. Squelch controller 80 consists of a "one-shot" or monostable multivibrator 83 and controllable switch S3. Whenever the receiver is turned on or switched to a new channel, one-shot 83 is triggered by a signal from receiver controller 82 via line 81. This results in maintaining S1 closed until one-shot 83 times out. Accordingly, the output of U1 remains at $V_{ref}$ until the receiver is on frequency.

Referring again to FIG. 3, after one-shot 83 times out and switch S1 opens at time $T_1$, the output of U1 is allowed to settle. A predetermined settling period later, at time $T_2$, receiver controller 82 activates controllable switch S3 via line 84 to permit CAS output line 93 to control switch S2 in the squelch circuit. At some later time, $T_2+\Delta$, if the CAS output is still low, the controller 82 will keep the receiver turned on. However, when CAS goes high (e.g., at the end of a transmission), the receiver reverts to a standby mode where it is only periodically turned on to see if a carrier signal is present. However, for a scanning receiver or for a priority search application, the receiver is permanently turned on but "peeks" at a priority channel to check if that channel is active by changing channels momentarily.

Although a few exemplary embodiments of the present invention have been described in detail, it is to be understood that the invention is not limited to the disclosed embodiments, but also may be modified while yet retaining one or more novel advantages. All such modifications and equivalent arrangements are intended to be included within the spirit and scope of the appended claims.

What is claimed is:

1. A fast acting noise squelch control system for a radio receiver operable in response to a detected noise voltage, comprising:

an integrating filler responsive to high-frequency noise for removing low-frequency voltage fluctuation from the detected noise voltage and for integrating the detected noise voltage;

a first switch coupled between an input and an output of said integrating filter for initializing said filter output to a first reference voltage;

a comparator, including a reference input, coupled to said integrating filter for comparing an integrated noise signal to a second reference voltage, applied to said reference input, and for generating a carrier activity signal when said integrated noise signal exceeds said second reference voltage, a second switch, responsive at least in part to said carrier activity signal and coupled between said reference input of said comparator and a circuit ground, for changing the value of said second reference voltage to dynamically alter a hysteresis of the squelch/unsquelch operation in said radio receiver; and a radio receiver controller circuit connected to receive said carrier activity signal from said comparator and to squelch or unsquelch audio circuits of said radio receiver in response thereto.

2. A fast acting noise squelch control system as in claim 1, further comprising:

a resistor divider network coupled between a voltage source and said integrating filter and said comparator for providing said first reference voltage to said integrating filter and said second reference voltage to said comparator.

3. A fast acting noise squelch control system as in claim 2, wherein said first reference voltage is less than said second reference voltage.

4. A fast acting noise squelch control system as in claim 3, wherein said first and second reference voltages are nearly equal.

5. A fast acting noise squelch system as in claim 1, wherein said comparator includes a high gain differential operational amplifier.

6. A fast acting noise squelch system as in claim 5, further comprising an additional resistor coupled between a noninverting input of said differential operational amplifier and said second switch for providing a third reference voltage to said comparator when said second switch is closed.

7. A fast acting noise squelch system as in claim 1, wherein said integrating filter includes an operational amplifier having a resistor and capacitor coupled in parallel between an output and an inverting input of said operational amplifier.

8. A fast acting noise squelch system as in claim 1, further comprising a microcontroller for monitoring an output of said comparator and for generating control signals for changing the state of said first and second switches.

9. A method for providing a fast acting noise squelch operation for an FM radio receiver having an above-audio band noise detector and a squelch control circuit comprising a noise integrating filter and a comparator, comprising the steps of:

initializing the output of the integrating filter at a first reference voltage;

providing the comparator with a second reference voltage that is slightly greater than said first reference voltage;

detecting above-audio band noise received by said radio receiver by said above-audio band noise detector;

integrating an above-audio band noise signal from said noise detector by said noise integrating filter to produce an integrated noise signal;

comparing said integrated noise signal at the output of said integrating filter with said second reference voltage by said comparator;

providing a signal indicative of the presence of a received RF carrier in response to the outcome of said comparing step; and determining whether squelching of the radio receiver output is desired in response to said carrier indicative signal.

10. A method for providing a fast acting noise squelch as described in claim 9, further comprising the step of:

changing said second reference voltage to a third reference voltage value that is significantly lower than either said first or second reference voltages after the presence of a carrier has been indicated for a predetermined period of time.

11. A method for providing a fast acting noise squelch as described in claim 9, further comprising the step of:

delaying said integrating step for a short predetermined interval after said initializing step to allow the receiver to lock on to a particular received signal.

12. A fast acting squelch control system for an RF radio receiver, said system being operable in response to detected noise signals on a given RF channel and comprising:

a noise signal integrating circuit, receiving a channel having an output which is preset to a predetermined initial value until the RF radio receiver has settled onto a newly tuned RF channel and which is thereafter released to follow detected noise signals present on such channel;

a noise level comparator circuit connected to compare the output of said noise signal integrating circuit to a threshold value which is initially set to a level having a known proximate relationship to said predetermined initial value and which said threshold value is reset to a substantially lower value a predetermined time interval after said noise integrating circuit preset output is released, establishing a predetermined level of operating hysteresis thereafter; and a squelch control circuit connected to receive the output of said comparator and to squelch or unsquelch audio circuits of said RF radio receiver in response thereto.

13. The squelch control system as set forth in claim 12, wherein said threshold value provided to said comparator is initially set to a level slightly greater than said predetermined initial value of said integrating circuit.

14. The squelch control system as set forth in claim 12, further comprising a microcontroller means for automatically resetting said threshold value in response to a predetermined output condition of said comparator circuit so as to dynamically effect a predetermined noise sensitivity hysteresis response for said radio receiver.

15. In a method for providing a fast acting squelch control for an RF radio receiver wherein said squelch is controlled in response to detected noise signals on a given RF channel, an improvement comprising the steps of:

presetting the output of a noise signal integrating circuit to a predetermined initial value;

applying a channel to said noise signal integrating circuit;

maintaining the output of the integrating circuit at said initial value until the RF radio receiver has settled onto the newly tuned RF channel;

releasing the output of the integrating circuit from said initial value after the radio receiver has settled onto the newly tuned RF channel to allow said output to follow detected noise signals present on such channel; and determining whether to squelch or unsquelch the radio receiver in response to the output from said noise signal integrating circuit being above or below a predetermined level.

16. In a method for providing a fast acting squelch control for an RF radio receiver wherein said squelch is controlled in response to detected noise signals on a given RF channel, an improvement comprising the steps of:

integrating said detected noise signals;

comparing said integrated noise signals to a set threshold value;

automatically resetting said threshold value to a substantially lower value at a predetermined time interval after said integrating of noise signals has begun so as to establish a predetermined level of operating hysteresis thereafter; and squelching or unsquelching audio circuits of said RF radio receiver in response to the results of said comparing step;

wherein the integrating of detected noise signals is initialized at a predetermined integration reference value and the integrated noise signals are first compared to said set threshold value, and wherein said set threshold value is initially set to a level having a known proximate relationship to said initial integration reference value.

17. A method for providing a fast acting squelch control for an RF radio receiver, said squelch controlled in response to detected noise signals on a given RF channel, comprising the steps of:

presetting the output of a noise signal integrating circuit to a predetermined initial value;

maintaining the output of the integrating circuit at said initial value until the RF radio receiver has settled onto a newly tuned RF channel;

releasing the output of the integrating circuit from said initial value to allow said output to follow detected noise signals present on such channel;

comparing the output of the integrating circuit to a threshold value which is initially set to a level having a known proximate relationship to said predetermined initial value;

resetting said threshold value to a substantially lower value at a predetermined time interval after said noise integrating circuit output is released so as to establish a predetermined level of operating hysteresis thereafter; and squelching or unsquelching audio circuits of said RF radio receiver in response to the results of said comparing step.

18. A method for providing a fast acting squelch control as described in claim 17, wherein the result of said comparing step is monitored by a microcontroller and said threshold value is conditionally reset to said substantially lower value depending on a predetermined result of said comparing step.

19. A method for providing a fast acting squelch control as described in claim 13, further comprising the steps of:

integrating said detected noise signals;

comparing said integrated noise signals to a set threshold value;

resetting said threshold value to a substantially lower value at a predetermined time interval after said integrating of noise signals has begun so as to establish a predetermined level of operating hysteresis thereafter; and squelching or unsquelching audio circuits of said RF radio receiver in response to the results of said comparing step.

* * * * *